US005464729A

United States Patent [19]

Hoebener et al.

[11] Patent Number: 5,464,729

[45] Date of Patent: Nov. 7, 1995

[54] PROCESS FOR CREATING AN IMAGE ON FILM USED IN SCREEN PRINTING

[76] Inventors: William H. Hoebener, 1342 N. Coach House Rd., Wichita, Kans. 67235; Christian M. Hoebener, 158 Karren Ct., Wichita, Kans. 67212

[21] Appl. No.: 335,157

[22] Filed: Nov. 7, 1994

[51] Int. Cl.$^6$ .......... G03F 5/00

[52] U.S. Cl. .......... 430/396; 430/327; 430/330; 427/147; 347/224

[58] Field of Search .......... 430/5, 325, 394, 430/327, 396, 330; 346/1.1, 76 PH; 427/147

[56] References Cited

U.S. PATENT DOCUMENTS 4,870,427 9/1989 Kobayashi .......... 346/1.1

*Primary Examiner*—Kathleen Duda
*Attorney, Agent, or Firm*—Edwin H. Crabtree; Donald W. Margolis; Ramon L. Dizawo

[57] ABSTRACT

A process for creating a thermal image for use in screen printing. The process includes the use of a photostencil film that consists of a clear transparent base carrier front side and an emulsion coated back side. The photostencil film is introduced into a thermal printer. The thermal printer is electronically coupled to a personal computer. The thermal printer is programmed to recognize digital information and convert the digital information into a thermal wax image. The thermal wax image is imprinted on the clear carrier front side of the photostencil film. Ultraviolet inhibitor additives and/or pigment opacity from the thermal printer provide the thermal wax image with an ultraviolet light barrier. All non-imprinted area's will remain photosensitive to ultraviolet light exposure. The photostencil film is fed through a light seal area into a timed ultraviolet light source. The carrier front side with the imprinted integral digital image is exposed to a timed ultraviolet light source. The ultraviolet light penetrates through the carrier front side and causes the unprotected and unmasked emulsion coated areas to harden on the film backside. After exposure, the photostencil film proceeds through a light seal area and is deposited into an exposed film storage. The exposed photostencil film can be removed from storage under light conditions and subjected to a water or chemical rinse. The unexposed non-hardened area protected by the ultraviolet light image barrier remain soft and will wash away.

14 Claims, 1 Drawing Sheet

PROCESS FOR CREATING AN IMAGE ON FILM USED IN SCREEN PRINTING

BACKGROUND OF INVENTION (a) Field of the Invention

This invention relates to the imprinting of images and artwork on clear transparent photostencil films and more particularly, but not by way of limitation, a process using a computer and thermal printer to create and imprint digital images and/or artwork on photostencil films. This process does not require added steps in creating camera ready artwork or a photo positive or negative for screen printing. The integral technique of the subject process provides for an efficient and economical means to process photostencil films for application to a clean screen mesh.

(b) Discussion of Prior Art

Heretofore, one process commonly used in the screen printing industry includes the applying of a liquid emulsion directly to a screen mesh mounted on a frame. The emulsion is allowed to dry. Artwork in the form of a positive or negative film, which is generated in a dark room, is then laid on the screen and exposed to a light source. The artwork is then removed. The screen is washed until the image is removed from the emulsion layer left from the artwork on the screen. The screen is dried and ink is applied through the image imprinted on the screen mesh.

A problem with the direct emulsion process is an operator is quite often unable to control the amount of emulsion applied on the screen. Therefore the various thicknesses of the emulsion layer cause color changes and associated problems. Also, any major problems related to ultraviolet light exposure on the emulsion layer may require the complete removal of the emulsion layer from the screen mesh. This procedure is time consuming and reduces the useable life of the screen mesh. Further, any foreign material or particles in the air will adhere to the emulsion causing spots and imperfections on the image requiring corrections by hand. Still further, the operator using this type of process may delay applying the emulsion to the screen until the artwork has been delivered and ready for processing.

Another common process used in screen printing includes applying a capillary or direct photostencil film on a screen mesh. Water is applied on the screen with an emulsion side of the direct film laid on top of the water surface. The excess water is removed and the direct film and screen are allowed to dry. Artwork such as a positive or negative film, which is generated in a dark room, is then laid on the direct film on the screen and exposed to a light source. The emulsion side of the direct film reacts to the image on the artwork. The artwork is then removed. The screen is washed until the image from the artwork is removed from the emulsion side of the direct film. The screen is dried and ink is applied through the image imprinted on the screen mesh.

A drawback in using the capillary or direct photostencil film is the requirement of having to use a vacuum table to draw the art work close to the face of the screen mesh. This procedure can be awkward due to the screen frame impeding the vacuum draw. Also, any foreign material or particles on the direct film or screen mesh will adhere to the emulsion causing spots and imperfections on the image requiring additional time to make corrections by hand. Further, washout when using direct film is difficult to control because no image background or color barrier is there to differentiate the removal of the emulsion layer on the film.

Still another common process in the screen printing industry is the use of indirect photostencil film. Artwork is generated in a darkroom using a separate photographic process to create a positive or negative. The indirect photostencil film and photonegative or positive is exposed to light and an image is imprinted on the emulsion side of the film. The image on the emulsion side is then washed out with water. The photostencil film is applied to a screen mesh and washed. Excess water removed from the screen mesh and the screen and film are allowed to dry. The clear base film is then removed leaving the emulsion layer and image imprint on the screen mesh. Ink is applied to the screen and the ink comes through the voided area's of the image on the screen mesh.

An obvious problem of the above mentioned screen processes when using either direct or indirect film is a dark room is required to develop a positive or a negative. The subject process eliminates the need of dark room generated film.

In U.S. Pat. No. 4,940,993 to Sato, an image recording apparatus using heat sensitive film and a thermal recording head is disclosed. This device is used in convection with a microcomputer. In U.S. Pat. No. 4,596,993 to Erlichman a thermal recording system is described that records on a film and is controlled by digital signals. U.S. Pat. No. 5,274,395 to Mizoguchi et al. describes using ink sheets with a thermal transfer system. The system is controlled by an image processing unit. U.S. Pat. No. 5,291,220 to Klees describes the use of a complex computer controlled thermal printer. The printer is designed to print a continuous tone image. U.S. Pat. No. 5,280,305 to Monroe and U.S. Pat. No. 5,149,613 to Stahlhofen et al. describe different types of thermal printing wherein a system is computer controlled for supplying signals from memory.

None of the above mentioned patents describe or teach a process for turning computer generated digital artwork into a screen printing image using a thermal image printer applied to photostencil film.

SUMMARY OF THE INVENTION

In view of the foregoing, it is an object of the present invention to provide a new process for creating a screen printing image quickly, efficiently and less costly when compared to currently used screen printing processes.

Another object of the invention is to provide a process where an image is computer generated and the computer operator can manipulate and enhance the image as desired. Also the image can be created in a matter of a few minutes. Further, the image can easily be stored and duplicated at a later date and electronically transmitted to remote locations where other screen printing operations are conducted.

Still another object of the subject process is the elimination of using a dark room or dry film process to produce an independent film negative or film positive with image. A digital image is imprinted directly on the clear base photostencil film using a thermal printer. Ultraviolet inhibitor additives and/or pigment opacity of the digital image deposition convert or change the digital image imprint into an ultraviolet barrier or image mask. The image imprint is now integral to the photostencil film. The immediate or absolute proximity of the image imprint to the emulsion layer provides the optimum image transfer condition for fine line details and sharp image contrast for screen process printing. Only a photostencil film is used in the subject process and no second image prints, artwork, positives or negatives are required.

Yet another object of the invention is the new process greatly reduces contamination on the artwork since only one film is used. Also, the artwork can be conveniently stored after being exposed to light and prior to film final processing. In the event of a ultraviolet light exposure failure the photostencil film may be discarded before application to the screen frame. This feature reduces clean up and rework activity.

Another object and advantage of the prescreen process is during the wash out of the emulsion on the photostencil film, the operator can clearly see a mirror image imprint and the color difference between the mirror image and the hardened emulsion on the film.

The screen printing industry currently has numerous photostencil films available for various screen mesh sizes, industry inks or water soluble chemicals and other art service applications. The inventors hereby propose the process will incorporate the use of a photostencil film bar code and/or software program to recognize the individual optimum film process characteristics including but not limited to exposure time, light intensity and process time.

The subject process includes the use of a photostencil film that consists of a clear transparent base carrier front side and an emulsion coated back side. The photostencil film is introduced into a thermal printer. The thermal printer is electronically coupled to a personal computer. The thermal printer is programmed to recognize digital information in the form of images and the like from the computer and convert the digital information into a thermal wax image. The thermal wax image is imprinted on the clear carrier front side of the photostencil film. Ultraviolet inhibitor additives and/or pigment opacity from the thermal printer provide the thermal wax image with an ultraviolet light barrier. All non-imprinted area's will remain photo-sensitive to ultraviolet light exposure.

The photostencil film is fed through a light seal area into a timed ultraviolet light source. The carrier front side with the imprinted integral digital image is exposed to a timed ultraviolet light source. The ultraviolet light penetrates through the carrier front side and causes the unprotected and unmasked emulsion coated areas to harden on the film backside. After exposure, the photostencil film proceeds through a light seal area and is deposited into an exposed film storage. The exposed photostencil film can be removed from storage under yellow light conditions and subjected to a water or chemical rinse. The unexposed non-hardened area protected by the ultraviolet light image barrier remain soft and will wash away. At this time an operator is able to visually confirm this condition due to the presence of the thermal wax image imprinted on the carrier front side of the photostencil film.

Final processing of the photostencil film to a clean screen mesh can be accomplished by using existing printing industry trade methods.

These and other objects of the present invention will become apparent to those familiar with screen printing processes from the following detailed description, showing novel construction, process steps and elements as herein described, and more particularly defined by the appended claims, it being understood that changes in the precise embodiments to the herein disclosed invention are meant to be included as coming within the scope of the claims, except insofar as they may be precluded by the prior art.

BRIEF DESCRIPTION OF THE DRAWINGS

The accompanying drawings illustrate complete preferred embodiments of the present invention according to the best modes presently devised for the practical application of the principles thereof, and in which.

DESCRIPTION OF THE PREFERRED EMBODIMENTS

Figure 1:
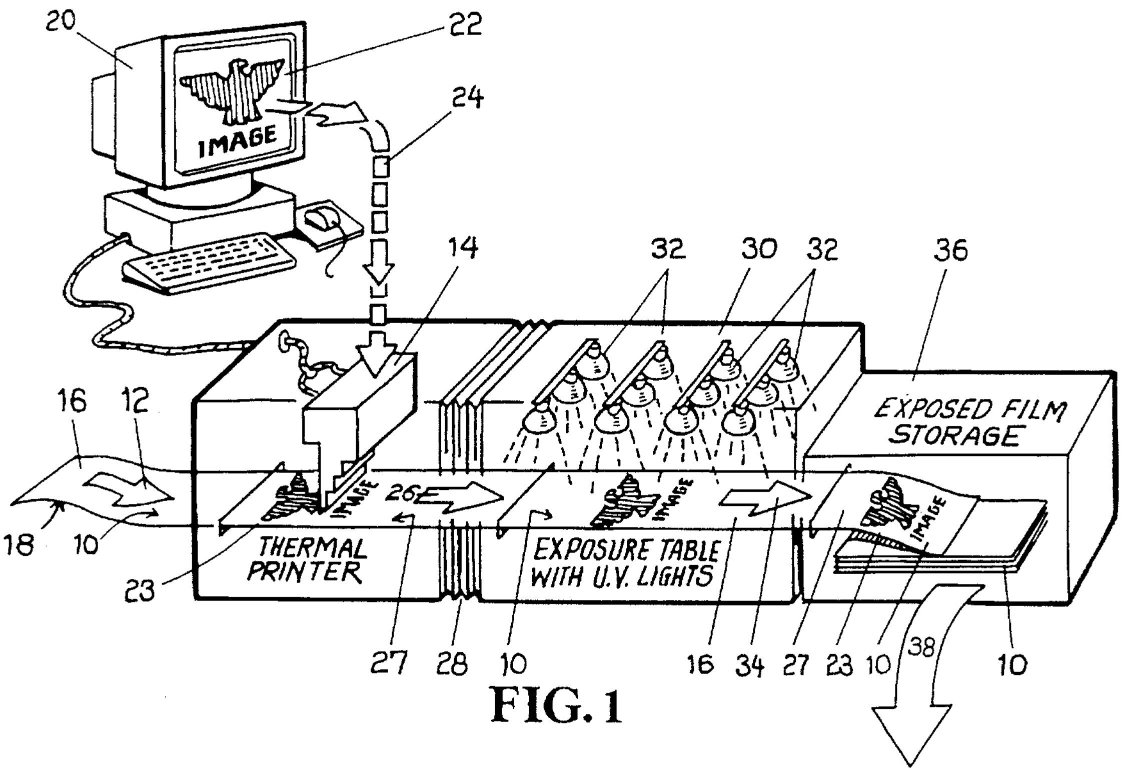
FIG. 1 is a perspective view of the initial steps of the subject process wherein the photostencil film is fed into a thermal printer. The printer is connected to a computer for receiving an art image produced therefrom. The film after receiving a protective thermal wax image from the printer is conveyed through a light seal area to an exposure table with ultraviolet lights. After a timed exposure to the ultraviolet light source, the photostencil film is fed into an exposed film storage area.

In FIG. 1, a perspective view of a sheet of photostencil film 10 is shown being fed as indicated by arrow 12 into a thermal printer 14. The photostencil film 10 is a standard commercial available film having a clear transparent carrier front side 16 and an emulsion coated back side 18. While the photostencil film 10 is discussed herein, it should be kept in mind that various types of film bases with light sensitive emulsions can be used equally well in the subject process as described. The film 10 may be in individual sheets or in the form of a continuous roll.

A computer 20 is used to generate an art image 22. The art image, as an image file, is electronically transmitted digitally, as indicated by arrows 24, to the thermal printer 14. The thermal printer 14 is programmed to recognize the digital image file from the computer 20 and converts the digital information into a thermal wax image 23. The thermal wax image 23 is imprinted with an ultraviolet inhibitor additives to create a ultraviolet image barrier on the carrier front side 16 of the photostencil film 10. The quality of the thermal wax image 23 is controlled by the ultraviolet barrier or ink opacity from the thermal printer 14. The ultraviolet inhibitor barrier covering the thermal wax image 23 on the clear carrier front side 16 of the film 10 prevents a mirror image 25, which is a voided area, on the emulsion coated back side 18 from reacting and hardening to the ultraviolet light exposure. An area 27 on the carrier front side 16 and surrounding the thermal wax image 23 is left unprotected and without a wax ultraviolet inhibitor barrier. It should be mentioned that while the color of the wax ultraviolet deposition is important, it is not as important as the ultraviolet light spectrum inhibiting ability of the wax transfer digital image.

The computer 20 with associated software and scanning device can be used to manipulate and enhance the image 22 as desired. Also, the image 22 can easily be stored using computer memory and electronically transferred if desired to other locations for use in different screen printing operations.

The photostencil film 10 is now fed as indicated by arrow 26 through a light seal area 28 and on to a timed ultraviolet light exposure table 30. The carrier front side 16 is exposed to ultraviolet lights 32 and all non-barrier unprotected areas on the emulsion coated back side 18 and corresponding to the unprotected area 27 on the front side 16 and the film 10 react and harden to the light exposure.

The mechanical design of the thermal printer's drive mechanism and exposure area will be required to accept various thickness of the films 10 and identify the optimum film processing characteristics. Also, a film bar code or software program can be used with the film 10 and computer 20 to change the operational parameters of the thermal printer 14 and exposure area to insure optimum parameters such as ultraviolet light exposure time, ultraviolet light intensity, film thickness, etc.

The exposed photostencil film 10 is now fed as indicated by arrow 34 to an exposed film storage 36. The storage 36 may be an enclosed storage area, a storage cassette, a storage tray and any other similar type storage unit. The exposed film 10 can be left in the storage 36 with other exposed film until needed at a later time. When it is desired to continue the process, the exposed film 10 is removed from storage 36 as indicated by arrow 38.

It should be mentioned that the multiple layers or color separation of the film 10 is controlled by the digital ability of the design software of the computer 20. The design software transfers registration marks precisely to all color layers.

Cross hair registration marks with circle therearound "+" applied to alternate corners of the carrier front side 16 of the photostencil film 10 establish master X and Y dimensional coordinates used for multi color screen printing applications. The registration marks on the film 10 are not shown in the drawings. The X and Y coordinates also provide a screen operator with a means to physically position the completed image to be screen printed. The interface of the design software of the computer 20 with the thermal wax printing process of the printer 14 maintains duplicate registration marks on each photostencil film 10. This process insures consistent positioning of each respective color separation layer during the final screen printing process.

The registration marks are printed when the thermal wax image 23 is deposited on carrier front side 16 of the photostencil film 10. The mirror image of the registration marks on the emulsion coated back side 18 are washed away during final film processing.

Figure 2:
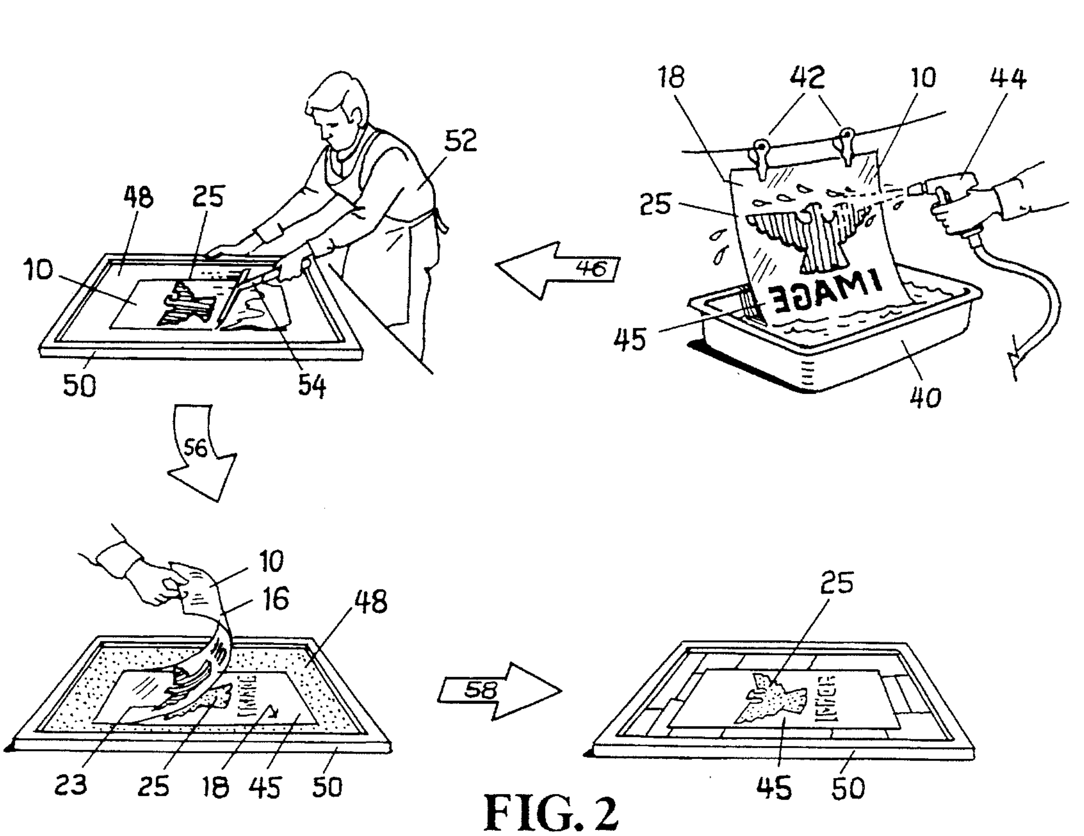
FIG. 2 illustrates the remaining steps of the process. The photostencil film is washed removing unhardened emulsion on the emulsion coated back side exposing a mirror image of the thermal wax image. The photostencil film is then placed on a wet screen mesh mounted on a frame. The emulsion bonds to the porous screen and after drying the remaining clear carrier front side of the film is removed. The hardened emulsion on the screen is now ready for the screen printing process.

In FIG. 2, the subject process is continued by suspending the exposed film 10 vertically above a wash pan 40 using clips 42. The unexposed emulsion area or masked image barrier area of the mirror image 25 not hardened on the emulsion coated back side 18 is washed away using a spray nozzles 44 or similar tool. The film 10 is washed with water and/or other compatible chemicals. By washing and removing the unhardened emulsion, the desired mirror image 25 surrounded by a hardened light exposed area 45 of the emulsion is left on the emulsion back side 18 of the photostencil film 10. As the unexposed emulsion layer is washed away, the digital image 23 appears on the carrier front side 16 of the film 10. The digital image 23 performs a dual role by visually confirming the accuracy of the film exposure time and the duration of the just completed washing step.

The emulsion back side 18 of the photostencil film 10 is then applied directly, as indicated by arrow 46, onto a clean screen mesh 48 mounted on a frame 50 for screen printing. An operator 52 washes the film 10 and screen mesh 48 with water and removes the excess water and smooth out the film 10 with a squeegee type tool 54. At this time, the remaining hardened emulsion on the back side 18 of the film 10 bonds to the porous screen mesh 48. The above mentioned action of smoothing out the film 10 assists in the capillary action of the emulsion layer micro bonding to the pores of screen mesh 48.

As indicated by arrow 56, the next step of the process is to allow the film 10 and screen mesh 48 to dry. After drying, the clear transparent carrier front side 16 with thermal wax image 23 thereon is peeled away from the screen mesh 48 leaving the emulsion from the back side 18 bonded to the screen mesh 48. The clear transparent base or carrier front side 16 with thermal wax image 23 is saved for use when positioning different articles to be screen printed. The hardened emulsion remains bonded to the screen mesh 48 to block out any area that it not to be printed during the screening process. The screen mesh 48 with image 25 is now ready for screen printing.

While the invention has been particularly shown, described and illustrated in detail with reference to the preferred embodiments and modifications thereof, it should be understood by those skilled in the art that changes in form and detail may be made therein without departing from spirit and scope of the invention as claimed, except as precluded by the prior art.

The embodiments of the invention for which an exclusive privilege and property right is claimed are defined as follows:

1. A process for creating an image on a film for use in screen printing, the film having a front side and an emulsion coated back side, the process steps comprising:

introducing the film into a printer, the printer electronically coupled to a computer, the printer programmed to recognize information in the form of a computer design image from the computer and converting the design image into a desired print image;

transferring a design image from the computer to the printer and converting the design image to a print image;

imprinting the print image with a light photosensitive protective barrier on the front side of the film;

exposing the film with print image to light, the light photosensitive protective barrier covering the print image on the front side and preventing a mirror image on the emulsion coated back side from reacting and hardening to the light exposure; and washing the emulsion coated back side of the exposed film and washing away the unhardened emulsion covering the mirror image.

2. The process as described in claim 1 further including after imprinting the film with a print image, the step of feeding the film with print image onto a timed light exposure table for exposing the film with print image to light.

3. The process as described in claim 2 further including after the step of exposing the film with print image to light, the step of feeding the exposed film into an exposed storage area to await further processing of the exposed film.

4. The process as described in claim 2 wherein the light is ultraviolet light and when the film is exposed to light the emulsion on the back side of the film surrounding the mirror image reacts and is hardened due to the ultraviolet light exposure.

5. The process as described in claim 1 wherein the printer is a thermal printer providing a thermal wax image with an ultraviolet photosensitive wax barrier for protecting the print image on the front side of the film.

6. A prescreen process for creating an image on a photostencil film for use in screen printing, the film having a clear transparent carrier front side and an emulsion coated back side, the process steps comprising:

introducing the film into a thermal printer, the thermal printer electronically coupled to a computer, the thermal printer programmed to recognize information in the form of a digital image from the computer;

transferring a digital image from the computer to the thermal printer and converting the digital image to a thermal wax image;

imprinting the thermal wax image with a light photosensitive barrier on the carrier front side of the film;

feeding the film with thermal wax image into a light exposure area;

exposing the film with thermal wax image to light, the photosensitive barrier covering the thermal wax image on the clear carrier front side and preventing a mirror image on the emulsion coated back side from reacting and hardening to the light exposure; and washing emulsion coated back side of the exposed film and washing away the unhardened emulsion covering the mirror image.

7. The process as described in claim 6 wherein the light is ultraviolet light and wherein the emulsion on the emulsion coated back side of the film surrounding the mirror image reacts and is hardened due to the ultraviolet light exposure.

8. The process as described in claim 6 wherein the thermal printer provides an ultraviolet photosensitive wax barrier for protecting the thermal wax image on the front side of the film.

9. A prescreen process for creating a thermal image on a photostencil film for use in screen printing, the film having a clear transparent carrier front side and an emulsion coated back side, the process steps comprising:

introducing the film into a thermal printer, the thermal printer electronically coupled to a computer, the thermal printer programmed to recognize digital information in the form of a digital image from the computer and converting the digital image into a thermal wax image;

transferring digital image from the computer to the thermal printer and converting the digital image to a thermal wax image;

imprinting the thermal wax image with an ultraviolet photosensitive wax barrier on the carrier front side of the film;

feeding the film with thermal image through a light seal area into a timed ultraviolet light exposure table;

exposing the film with thermal wax image to ultraviolet light, the photosensitive wax barrier covering the thermal wax image on the clear carrier front side and preventing a mirror image on the emulsion coated back side from reacting and hardening to the ultraviolet light exposure; and washing the emulsion coated back side of the exposed film and washing away the unhardened emulsion covering the mirror image.

10. The process as described in claim 9 further including the step of applying the emulsion back side of the film directly on top of a clean screen mesh for screen printing.

11. The process as described in claim 9 further including the step of washing the film on top of the screen mesh and drying the film and screen mesh allowing the emulsion on the back side of the film to adhere to the surface of the screen mesh.

12. The process as described in claim 9 further including the step of when imprinting the thermal wax image with a light photosensitive barrier on the carrier front side of the film the added step of imprinting X and Y coordinates in the corners of the film and imprinting the coordinates with a light photosensitive barrier.

13. The process as described in claim 9 further including after imprinting the film with a thermal wax image, the step of feeding the film with thermal wax image through a light seal area and onto a timed light exposure table for exposing the film with thermal wax image to ultraviolet light.

14. The process as described in claim 9 further including after the step of exposing the film with thermal wax image to ultrviolet light, the step of feeding the exposed film to storage to await further processing of the exposed film.

* * * * *